United States Patent
Yoshida et al.

(10) Patent No.: US 8,564,878 B2
(45) Date of Patent: Oct. 22, 2013

(54) OPTICAL AMPLIFIER, CONTROL CIRCUIT, AND OPTICAL AMPLIFIER CONTROL METHOD

(75) Inventors: Setsuo Yoshida, Kawasaki (JP); Kyosuke Sone, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 348 days.

(21) Appl. No.: 12/947,396

(22) Filed: Nov. 16, 2010

(65) Prior Publication Data

US 2011/0116161 A1    May 19, 2011

(30) Foreign Application Priority Data

Nov. 17, 2009  (JP) .................................. 2009-262354

(51) Int. Cl.
*H01S 5/00* (2006.01)
*H04B 10/12* (2011.01)

(52) U.S. Cl.
USPC ...................................... 359/344; 359/341.42

(58) Field of Classification Search
USPC ........................................... 359/341.42, 344
See application file for complete search history.

(56) References Cited

U.S. PATENT DOCUMENTS

| | | | |
|---|---|---|---|
| 5,521,751 A | 5/1996 | Aida et al. | |
| 2004/0136055 A1* | 7/2004 | Michie et al. | 359/337.11 |
| 2005/0105170 A1 | 5/2005 | Shukunami et al. | |
| 2006/0024063 A1* | 2/2006 | Onaka et al. | 398/149 |
| 2010/0321768 A1* | 12/2010 | Sone | 359/337 |

FOREIGN PATENT DOCUMENTS

| | | |
|---|---|---|
| JP | 06-021582 | 1/1994 |
| JP | 07-226549 | 8/1995 |
| JP | 08-111664 | 4/1996 |
| JP | 10-209967 | 8/1998 |
| JP | 2003-046186 A | 2/2003 |
| JP | 2003-258386 | 9/2003 |
| JP | 2005-150435 | 6/2005 |
| JP | 2009-065180 | 3/2009 |
| JP | 2009-244163 | 10/2009 |

OTHER PUBLICATIONS

Japanese Office Action mailed Aug. 20, 2013 for corresponding Japanese Application No. 2009-262354, with English-language translation.

* cited by examiner

*Primary Examiner* — Eric Bolda
(74) *Attorney, Agent, or Firm* — Fujitsu Patent Center

(57) ABSTRACT

An optical amplifier includes a semiconductor optical amplifier, a power monitor configured to monitor an optical power of out-of-signal-band noise output from the semiconductor optical amplifier, and a corrector configured to correct a relationship between a driving current for the semiconductor optical amplifier and a noise optical power based on the out-of-signal-band noise optical power monitored by the first power monitor.

9 Claims, 13 Drawing Sheets

FIG. 3A

| DRIVING CURRENT | FACTORY DEFAULT OUT-OF-SIGNAL-BAND ASE POWER |
|---|---|
| I1 | Q1 |
| ⋮ | ⋮ |
| Ik' | Qk' |
| ⋮ | ⋮ |
| In | Qn |

FIG. 3B

| DRIVING CURRENT | FACTORY DEFAULT IN-SIGNAL-BAND ASE POWER |
|---|---|
| I1 | P1 |
| I2 | P2 |
| ⋮ | ⋮ |
| In | Pn |

FIG. 3C

| DRIVING CURRENT | TARGET TOTAL OUTPUT OPTICAL POWER |
|---|---|
| I1 | $S+P1 \times Q/Qk'$ |
| I2 | $S+P2 \times Q/Qk'$ |
| ⋮ | ⋮ |
| In | $S+Pn \times Q/Qk'$ |

OPTICAL AMPLIFIER, CONTROL CIRCUIT, AND OPTICAL AMPLIFIER CONTROL METHOD

CROSS-REFERENCE TO RELATED APPLICATION

This application is based upon and claims the benefit of priority of the prior Japanese Patent Application No. 2009-262354, filed on Nov. 17, 2009, the entire contents of which are incorporated herein by reference.

FIELD

The embodiments discussed herein are related to an optical amplifier, a control circuit, and an optical amplifier control method.

BACKGROUND

In optical communication networks, semiconductor optical amplifiers (SOAs) are used. An automatic level control (ALC) operation for such a semiconductor optical amplifier is achieved by monitoring optical power output from the semiconductor optical amplifier and performing feedback control of a driving current for the semiconductor optical amplifier.

A signal light intensity control apparatus has been proposed for monitoring output signals including an amplified spontaneous emission (ASE) signal and controlling the driving current with a feedback configuration including an average value monitor (see, for example, Japanese Laid-open Patent Publication No. 2003-46186).

It is assumed that the control of the driving current based on the relationship between the driving current and ASE is performed with the technique disclosed in Japanese Laid-open Patent Publication No. 2003-46186. In this case, when the relationship between the driving current and ASE is changed, it is necessary to interrupt an input signal and correct the relationship.

SUMMARY

An optical amplifier according to an embodiment of the present invention includes a semiconductor optical amplifier, a power monitor configured to monitor an optical power of out-of-signal-band noise output from the semiconductor optical amplifier, and a corrector configured to correct a relationship between the driving current for the semiconductor optical amplifier and a noise optical power based on the out-of-signal-band noise optical power monitored by the first power monitor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 3A to 3C describe tables stored in databases.

DESCRIPTION OF EMBODIMENTS

Embodiments will be described below with reference to the accompanying drawings.

First Embodiment

Figure 1:
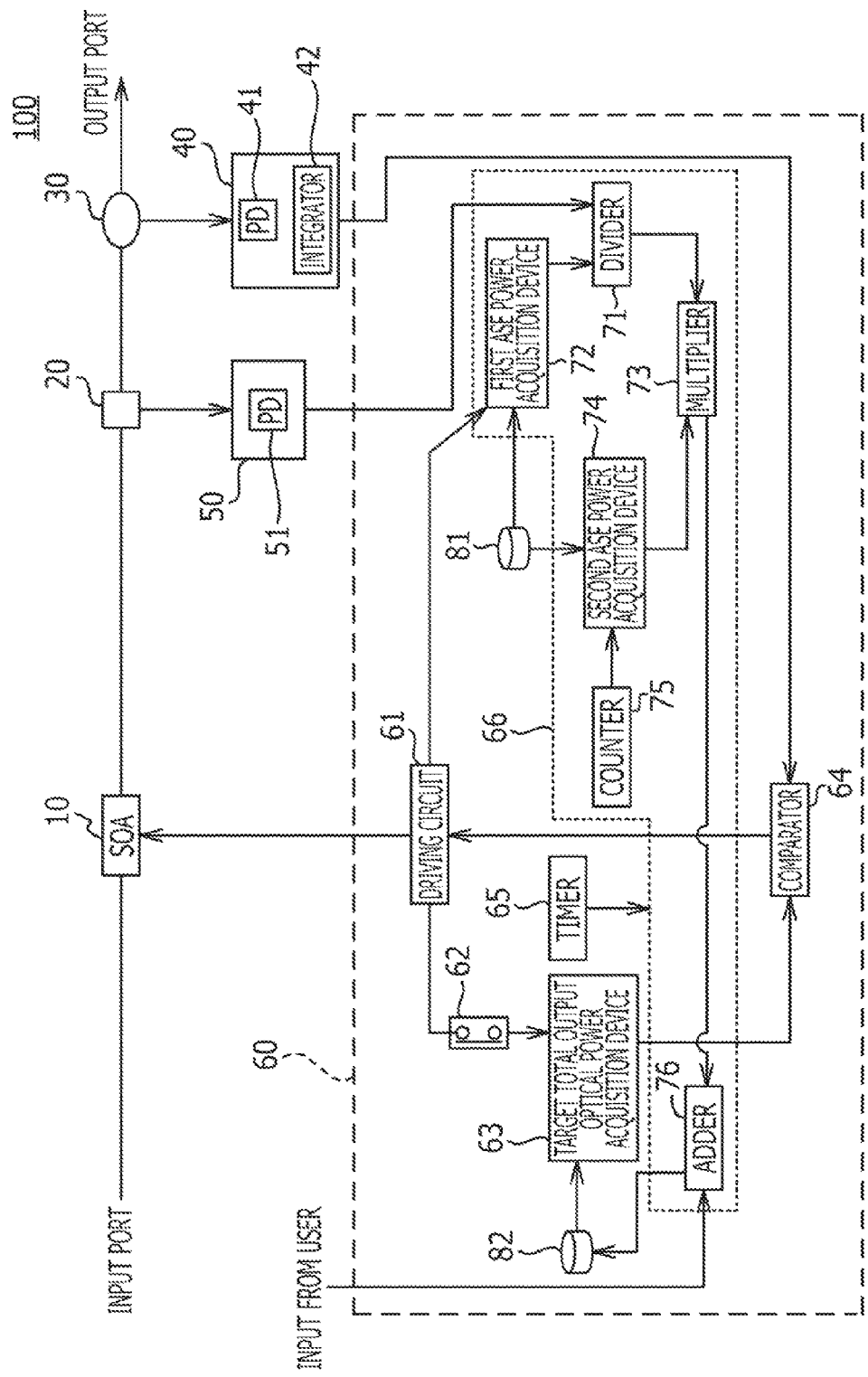
FIG. 1 describes an entire configuration of an optical amplifier according to a first embodiment.

FIG. 1 is a block diagram describing an entire configuration of an optical amplifier 100 according to the first embodiment. The optical amplifier 100 includes a semiconductor optical amplifier (SOA) 10, an optical band pass filter 20, an optical coupler 30, a first optical power monitor 40, a second optical power monitor 50, and a control circuit 60.

The semiconductor optical amplifier 10 is a semiconductor device for amplifying an input optical signal and outputting the amplified optical signal. The semiconductor optical amplifier 10 generates noise optical power in accordance with the driving current. The noise optical power is, for example, amplified spontaneous emission (ASE) power.

The optical band pass filter 20 is a filter for transmitting the wavelength of an input optical signal. The optical coupler 30 branches an input optical signal. The first optical power monitor 40 includes a photodiode 41 and an integrator 42. The second optical power monitor 50 includes a photodiode 51. The control circuit 60 includes a central processing unit (CPU), a read-only memory (ROM), and a random access memory (RAM).

Figure 2:
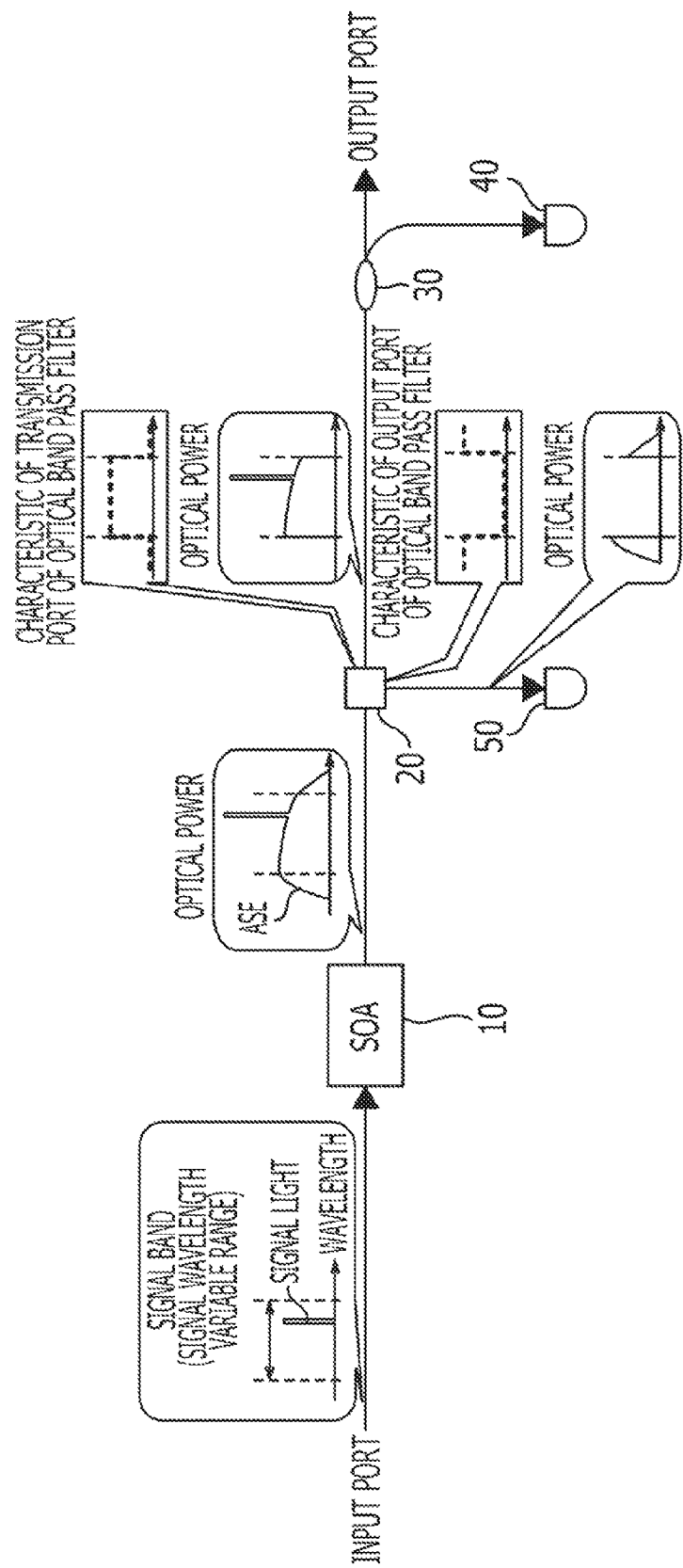
FIG. 2 describes the transmission characteristic of each device and the component of an optical signal passing through the device.

Next, the operation of the optical amplifier 100 will be described with reference to FIGS. 1 and 2. FIG. 2 describes the transmission characteristics of each device and the component of an optical signal passing through the device. In a graph indicating a transmission characteristic illustrated in FIG. 2, a horizontal axis represents a wavelength, and a vertical axis represents transmission optical power (dB). In a graph indicating the component of an optical signal illustrated in FIG. 2, a horizontal axis represents a wavelength, and a vertical axis represents optical power (dB).

An optical signal input into the input port of the optical amplifier 100 is light of a predetermined wavelength in a signal band. The signal band is a range in which the wavelength of a signal input into the optical amplifier 100 is variable. Accordingly, the signal band is changed with the type and application of an optical amplifier. For example, as the signal band, the band of 1.3 or 1.5 µm may be used.

The optical signal, which has been input into the input port of the optical amplifier 100, is input into the semiconductor optical amplifier 10. The semiconductor optical amplifier 10 amplifies the optical signal in accordance with the driving current input from the control circuit 60 and outputs the amplified optical signal to the optical band pass filter 20. Light output from the semiconductor optical amplifier 10 includes an ASE component. The optical band pass filter 20 outputs a component of the light output from the semiconductor optical amplifier 10 in the signal band (in-signal-band component) from a first port thereof to transmit the component to the optical coupler 30, and outputs a component of the light outside the signal band (out-of-signal-band component) from a second port thereof to transmit the component to the second optical power monitor 50. In this embodiment, the first port is a transmission port, and the second port is an output port.

The optical coupler 30 inputs a part of the in-signal-band component output from the first port of the optical band pass filter 20 into the first optical power monitor 40 and outputs a remaining part of the in-signal-band component from an output port of the optical amplifier 100. The control circuit 60 performs processing for controlling the driving current for the semiconductor optical amplifier 10 based on results of monitoring of the first optical power monitor 40 and the second optical power monitor 50 so that total output optical power of the semiconductor optical amplifier 10 becomes a desired value. Since the optical branching percentage of the optical coupler 30 is fixed, it is possible to calculate the total output optical power of the semiconductor optical amplifier 10 from the result of the monitoring of the first optical power monitor 40.

The integrator 42 is an electric low-pass filter. Since an optical signal that has been subjected to intensity modulation is input into the optical amplifier 100, the integrator 42 is provided in the first optical power monitor 40 for monitoring an in-signal-band component so as to perform time averaging on the intensity-modulated component. The second optical power monitor 50 for monitoring an out-of-signal-band component does not include an integrator. When the intensity-modulated component of the optical signal input into the optical amplifier 100 interferes with the measurement of the ASE power of an out-of-signal-band component, the second optical power monitor 50 may include an integrator. The photodiodes 41 and 51 monitor a light intensity over a full wavelength band.

Next, the control circuit 60 will be described in detail below. Referring to FIG. 1, the control circuit 60 includes a driving circuit 61, a relay 62, a target total output optical power acquisition device 63, a comparator 64, a timer 65, and an updating circuit 66. The updating circuit 66 includes a divider 71, a first ASE power acquisition device 72, a multiplier 73, a second ASE power acquisition device 74, a counter 75, and an adder 76.

Next, the operation of the control circuit 60 will be described in detail below with reference to FIG. 1. The driving circuit 61 inputs driving current information Ik about the driving current for the semiconductor optical amplifier 10 into the target total output optical power acquisition device 63. Here, "k" is an integer in the range of 1 to n, and "n" is a positive number representing the last line in a mathematical table. The driving current information Ik is a value of the driving current input from the driving circuit 61 into the semiconductor optical amplifier 10.

The target total output optical power acquisition device 63 reads the target total output optical power Dk corresponding to the driving current information Ik from a database 82 and inputs the target total output optical power Dk into the comparator 64. The target total output optical power is a target value of total output optical power of the semiconductor optical amplifier 10. On the other hand, the integrator 42 included in the first optical power monitor 40 integrates electric signals obtained by photoelectric conversion performed by the photodiode 41, monitors total output optical power T of the semiconductor optical amplifier 10, and inputs the total output optical power T into the comparator 64.

The comparator 64 compares the total output optical power T and the target total output optical power Dk with each other. When the target total output optical power Dk is higher than the total output optical power T, the driving circuit 61 increases the driving current for the semiconductor optical amplifier 10. When the target total output optical power Dk is lower than the total output optical power T, the driving circuit 61 reduces the driving current for the semiconductor optical amplifier 10. When the target total output optical power Dk is equal to the total output optical power T, the driving circuit 61 maintains the driving current as-is for the semiconductor optical amplifier 10. Since the total output optical power of the semiconductor optical amplifier 10 is set to a desired value by controlling the driving current, signal output optical power is set to a target signal output power.

When the relationship between the driving current for the semiconductor optical amplifier 10 and ASE power is unchanged, it is possible to set the signal output optical power of the semiconductor optical amplifier 10 to the target signal output optical power S desired by a user by executing the above-described control processing. However, the relationship between the driving current and the ASE power may be changed due to the deterioration of the semiconductor optical amplifier 10. Accordingly, in this embodiment, the relationship between the driving current and the ASE power is corrected without interrupting a signal input into the semiconductor optical amplifier 10.

The timer 65 inputs an updating start signal into the updating circuit 66 at predetermined intervals. Upon receiving the updating start signal as a trigger, the updating circuit 66 operates. More specifically, the first ASE power acquisition device 72 acquires driving current information Ik' from the driving circuit 61. The driving current information Ik' is a value of the driving current input from the driving circuit 61 into the semiconductor optical amplifier 10 at the time of startup of the updating circuit 66.

The first ASE power acquisition device 72 acquires factory default out-of-signal-band ASE power Qk' corresponding to the driving current information Ik' from a database 81 and inputs the factory default out-of-signal-band ASE power Qk' into the divider 71. The factory default out-of-signal-band ASE power Qk' is out-of-signal-band ASE power obtained when the driving current for the semiconductor optical amplifier 10 is Ik' at the time of factory shipment of the semiconductor optical amplifier 10. On the other hand, the second optical power monitor 50 acquires out-of-signal-band ASE power Q with the photodiode 51.

If degradation of the semiconductor optical amplifier 10 does not occur, the factory default out-of-signal-band ASE power Qk' is equal to the out-of-signal-band ASE power Q monitored by the second optical power monitor 50. However, when the degradation of the semiconductor optical amplifier 10 occurs, the factory default out-of-signal-band ASE power Qk' differs from the out-of-signal-band ASE power Q monitored by the second optical power monitor 50. When out-ofsignal-band ASE power is α times as high as before, it can be assumed that in-signal-band ASE power is approximately α times as high as before. Furthermore, when ASE power is α times as high as before at the driving current Ik', it can be assumed that ASE power is approximately α times as high as before at another driving current.

The divider 71 acquires the ratio between the out-of-signal-band ASE power Q and the factory default out-of-signal-band ASE power Qk', Q/Qk', as a correction coefficient and inputs the correction coefficient into the multiplier 73. The counter 75 sequentially assigns from "1" to "n" to a variable "j" and inputs the variable j into the second ASE power acquisition device 74. The second ASE power acquisition device 74 acquires from the database 81 factory default in-signal-band ASE power Pj corresponding to the variable j input from the counter 75 and inputs the factory default in-signal-band ASE power Pj into the multiplier 73. The factory default in-signal-band ASE power Pj is in-signal-band ASE power obtained when the driving current for the semiconductor optical amplifier 10 is Ij at the time of factory shipment of the semiconductor optical amplifier 10. The multiplier 73 multiplies the factory default in-signal-band ASE power Pj by Q/Qk' and inputs a result of the multiplication of Pj×Q/Qk' into the adder 76.

The adder 76 receives target signal output optical power S input by a user. The target signal output optical power S is a value set by a user, and is a value obtained by subtracting ASE power from the target total output optical power of the semiconductor optical amplifier 10. The adder 76 adds the result of the multiplication of Pj×Q/Qk' input from the multiplier 73 to the target signal output optical power S, associates a result of the addition with a corresponding driving current, and stores them in the database 82. As a result, a table stored in the database 82 is updated at predetermined time intervals.

While the updating circuit 66 is running, a relay 62 is in an OFF state. In this case, the transmission of the target total output optical power Dk to the comparator 64 is stopped. This stops feedback control of output optical power of the semiconductor optical amplifier 10. When the operation of the updating circuit 66 ends, the relay 62 is brought into an ON state again. Accordingly, when the operation of the updating circuit 66 ends, feedback control of output optical power of the semiconductor optical amplifier 10 is restarted.

FIGS. 3A to 3C describe tables stored in the databases 81 and 82. Referring to FIG. 3A, the database 81 stores a table describing the relationship between a driving current (I1 to In) for the semiconductor optical amplifier 10 and corresponding factory default out-of-signal-band ASE power (Q1 to Qn). Referring to FIG. 3B, the database 81 further stores a table describing the relationship between a driving current (I1 to In) for the semiconductor optical amplifier 10 and corresponding factory default in-signal-band ASE power (P1 to Pn). The tables illustrated in FIGS. 3A and 3B are not updated. The database 81 is stored in a nonvolatile memory such as a ROM.

Referring to FIG. 3C, the database 82 stores a table describing the relationship between a driving current (I1 to In) and corresponding target total output optical power (D1 to Dn), which is updated with the driving current Ik' obtained at the time of startup of the updating circuit 66. The table illustrated in FIG. 3C is updated each time the startup of the updating circuit 66 is performed. The database 82 is stored in a rewritable memory such as a RAM.

Figure 4:
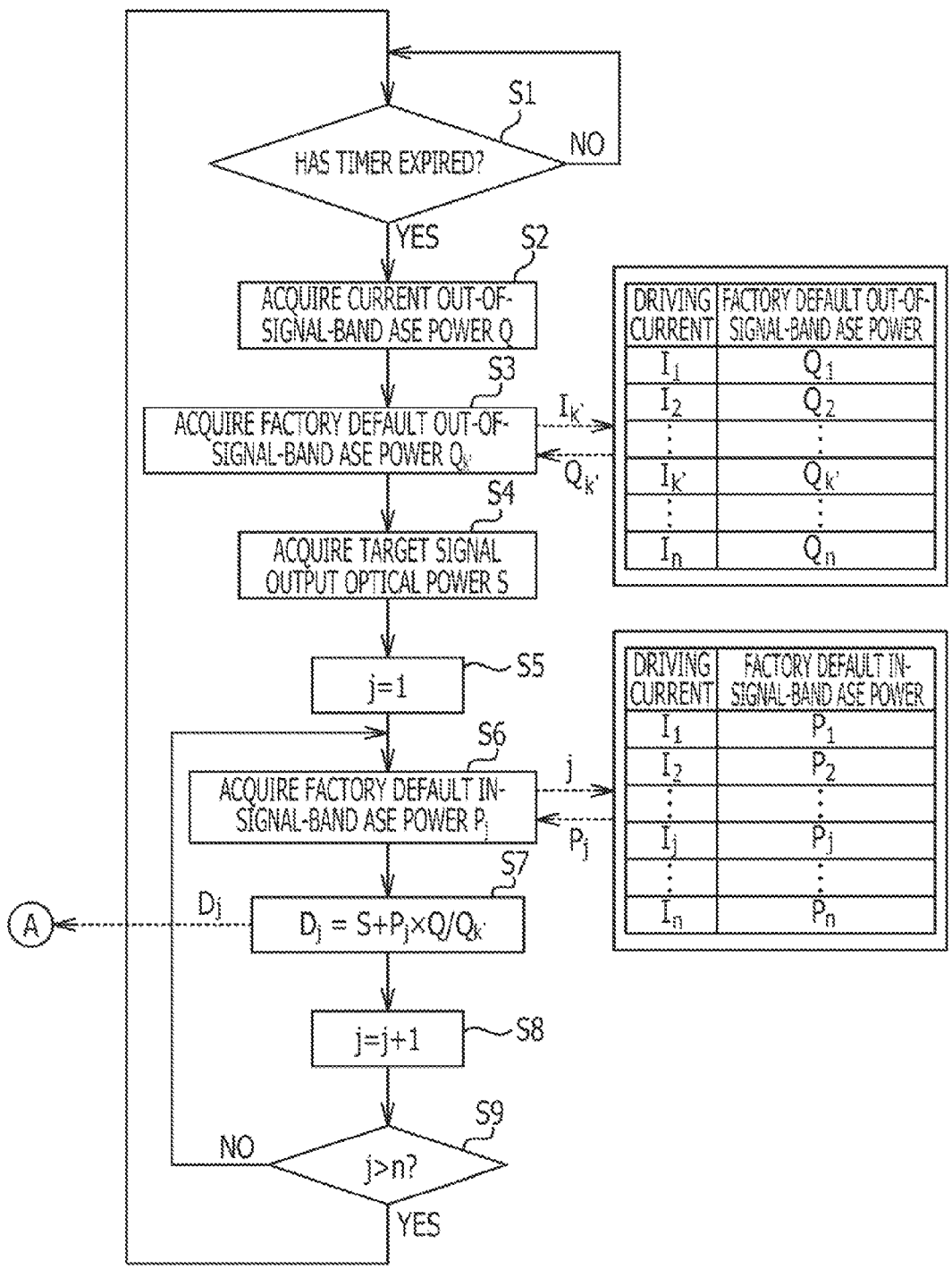
FIG. 4 describes an example of a method performed when an updating circuit is in an active state.
Figure 5:
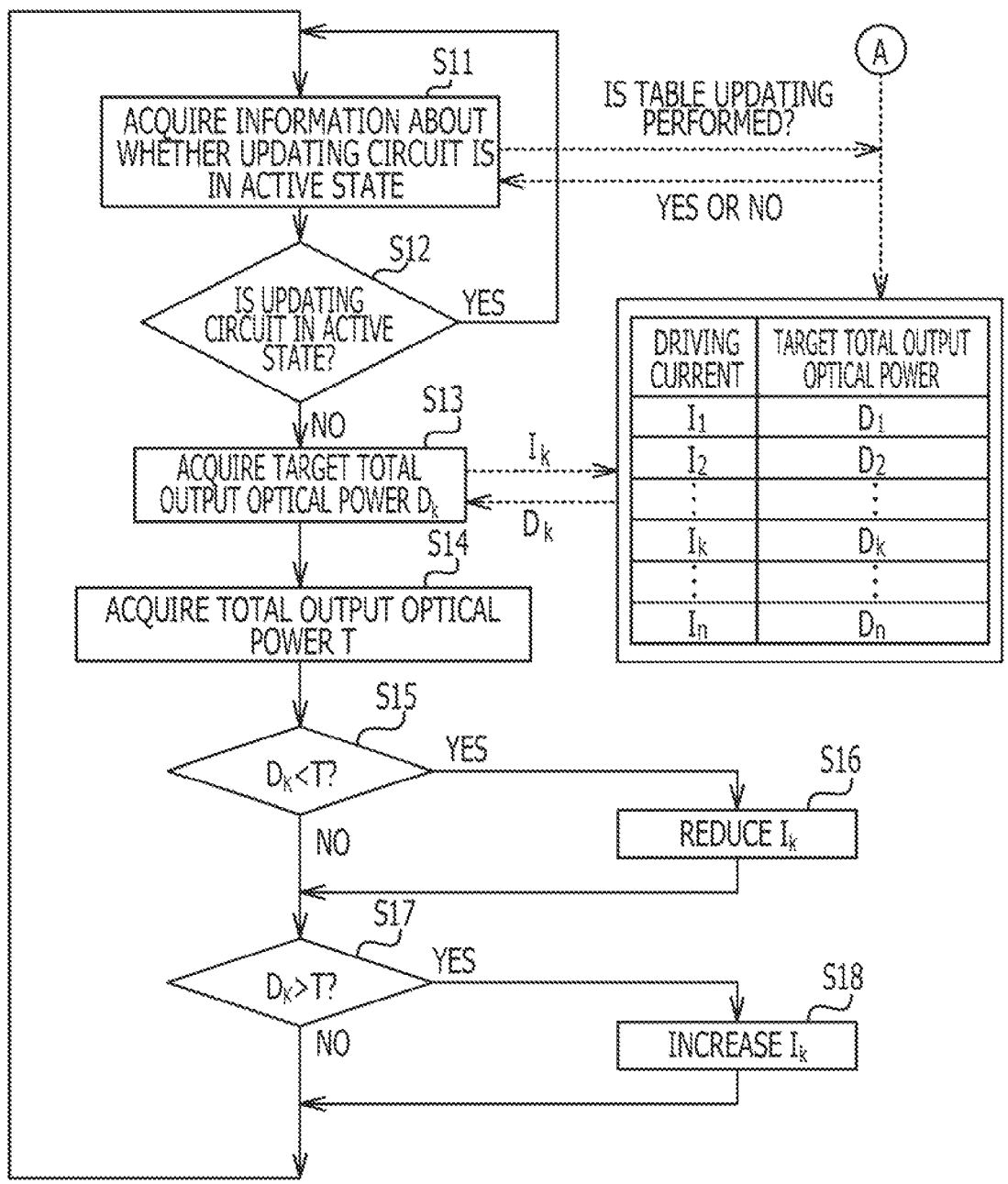
FIG. 5 describes an example of a method performed when the updating circuit is in an inactive state.

FIG. 4 describes an example of a method performed when the updating circuit 66 is in an active state. FIG. 5 describes an example of a method performed when the updating circuit 66 is in an inactive state.

Referring to FIG. 4, the timer 65 determines whether a timer for providing a notification of a table update time has expired (operation S1). When the determination result is No in operation S1, the timer 65 repeats operation S1. When the determination result is Yes in operation S1, the updating circuit 66 is activated. First, the updating circuit 66 acquires the out-of-signal-band ASE power Q from the second optical power monitor 50 (operation S2).

Next, the first ASE power acquisition device 72 acquires from the database 81 the factory default out-of-signal-band ASE power Qk' by using the driving current Ik' at the time of startup of the updating circuit 66 as a search key (operation S3). The factory default out-of-signal-band ASE power Qk' is searched for using a table describing the relationship between the driving current and corresponding factory default out-of-signal-band ASE power stored in the database 81.

The updating circuit 66 acquires the target signal output optical power S input by a user (operation S4). The counter 75 sets j to 1 (operation S5). The second ASE power acquisition device 74 acquires the factory default in-signal-band ASE power Pj from the database 81 (operation S6). The factory default in-signal-band ASE power Pj is searched for using a table describing the relationship between the driving current and corresponding factory default in-signal-band ASE power stored in the database 81.

The divider 71, the multiplier 73, and the adder 76 perform computation so as to obtain a computation result of Dj=S+Pj×Q/Qk' (operation S7). A computation result is stored in the database 82. The counter 75 adds 1 to j (operation S8). The counter 75 determines whether j is larger than n (operation S9). When the determination result is No in operation S9, operation S6 is performed. When the determination result is Yes in operation S9, operation S1 is performed. As a result, the table describing the relationship between the driving current and corresponding target total output optical power stored in the database 82 is updated.

Referring to FIG. 5, the target total output optical power acquisition device 63 acquires information about whether the updating circuit 66 is in an active state (operation S11). The target total output optical power acquisition device 63 determines whether the updating circuit 66 is in the active state (operation S12). When the determination result is Yes in operation S12, operation S11 is performed. When the determination result is No in operation S12, the target total output optical power acquisition device 63 acquires from the database 82 the target total output optical power Dk by using the driving current Ik as a search key (operation S13).

The control circuit 60 acquires the total output optical power T from the first optical power monitor 40 (operation S14). The comparator 64 determines whether the target total output optical power Dk is lower than the total output optical power T (operation S15). When the determination result is Yes in operation S15, the driving circuit 61 reduces the driving current (operation S16).

When it is determined that the target total output optical power Dk is not lower than the total output optical power T after operation S16 has been performed or when the determination result is No in operation S15, the comparator 64 determines whether the target total output optical power Dk is higher than the total output optical power T (operation S17). When the determination result is Yes in operation S17, the driving circuit 61 increases the driving current (operation S18). When it is determined that the target total output optical power Dk is not higher than the total output optical power T after operation S18 has been performed or when the determination result is No in operation S17, operation S11 is performed. Consequently, the total output optical power of the semiconductor optical amplifier 10 is set to a desired value. The signal output optical power is therefore set to the target signal output power.

In this embodiment, by monitoring out-of-signal-band ASE power, the relationship between the driving current for the semiconductor optical amplifier 10 and ASE power can be corrected. It is therefore unnecessary to interrupt an input signal when the relationship between the driving current for the semiconductor optical amplifier 10 and ASE power is corrected. Furthermore, it is possible to freely set a correction interval at which the relationship between the driving current for the semiconductor optical amplifier 10 and ASE power is corrected. By setting a short correction interval, it is possible to respond to a sudden change in ASE power of the semiconductor optical amplifier 10. Since the optical band pass filter 20 is provided at a stage prior to the first optical power monitor 40, ASE power input into the first optical power monitor 40 is reduced by out-of-signal-band ASE power. This reduces ASE power included in the output of the optical amplifier 100 and enables errorless control of the semiconductor optical amplifier 10.

In this embodiment, the updating circuit 66 functions as a corrector for correcting the relationship between the driving current for the semiconductor optical amplifier 10 and ASE power. The optical band pass filter 20 and the second optical power monitor 50 function as a noise optical power monitor for monitoring out-of-signal-band noise optical power output from the semiconductor optical amplifier 10. The first optical power monitor 40 functions as an optical power monitor for monitoring total output optical power of light output from the semiconductor optical amplifier 10. The driving circuit 61 functions as a driver for controlling the driving current for the semiconductor optical amplifier 10. The database 82 functions as a memory for storing the relationship between the driving current and target total output optical power in the form of a table.

First Modification

Figure 6A:
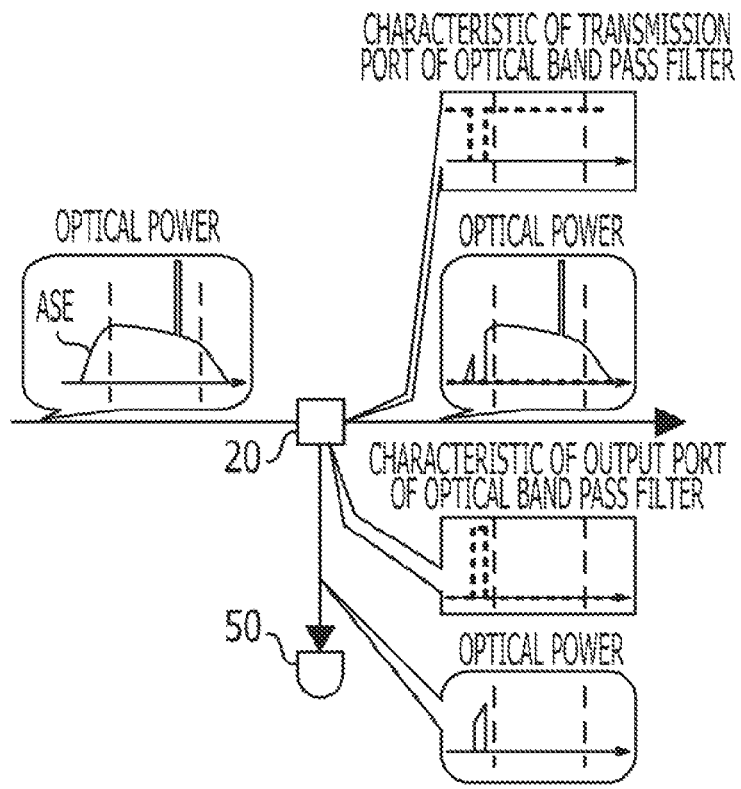
FIG. 6A describes an optical band pass filter for partly outputting a band component on the shorter wavelength side with respect to a signal band from a second port thereof.
Figure 6B:
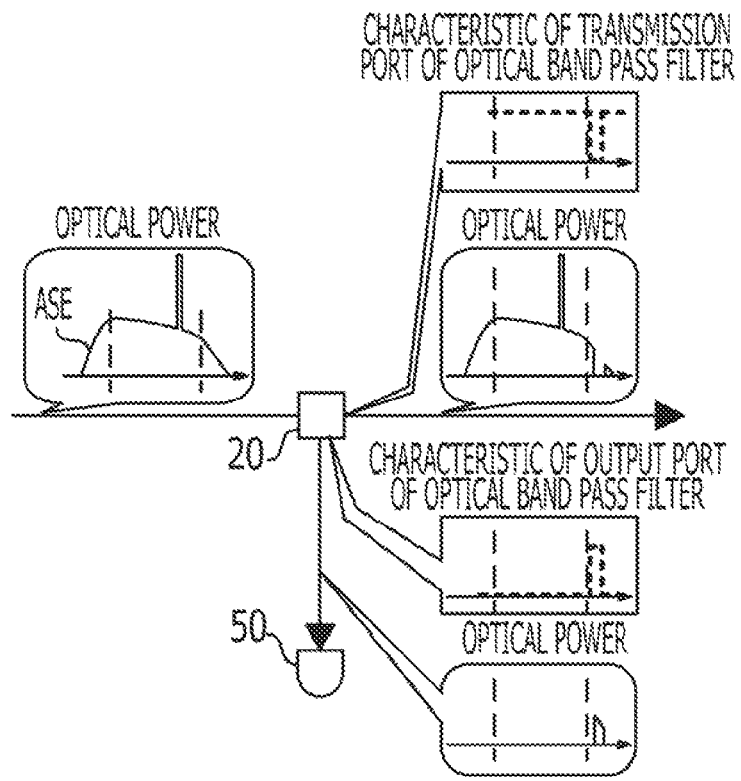
FIG. 6B describes an optical band pass filter for partly outputting a band component on the longer wavelength side with respect to a signal band from a second port thereof.

Instead of the optical band pass filter 20, an optical band pass filter for outputting a predetermined part of an out-of-signal-band component without transmitting the predetermined part of an out-of-signal-band component may be used. FIG. 6A describes the optical band pass filter 20 for partly outputting a band component on the shorter wavelength side with respect to the signal band from the second port thereof and outputting the other band component from the first port thereof. FIG. 6B describes the optical band pass filter 20 for partly outputting a band component on the longer wavelength side with respect to the signal band from the second port thereof and outputting the other band component from the first port thereof. Thus, the second optical power monitor 50 may partly monitor a component outside the signal band.

Second Modification

Figure 7A:
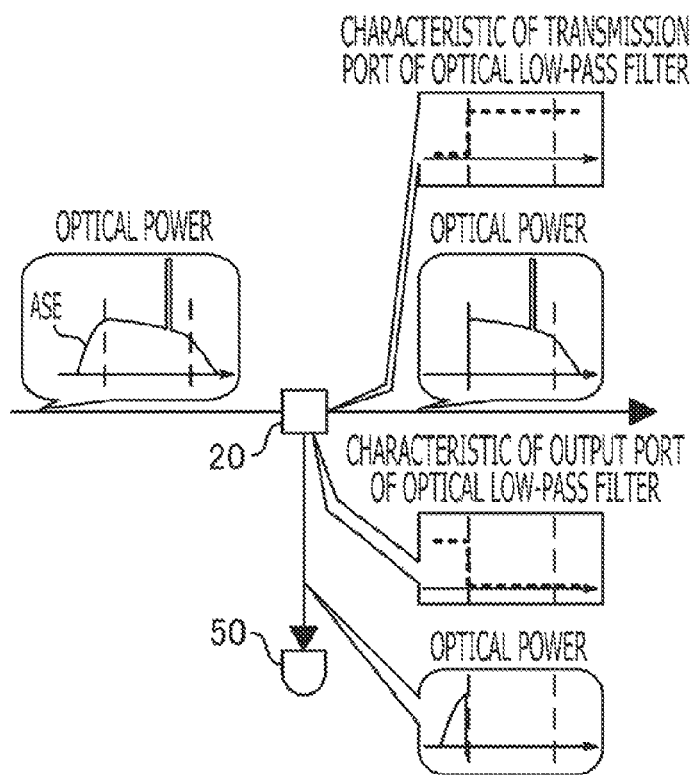
FIG. 7A describes a case in which an optical low-pass filter is used.

Instead of the optical band pass filter 20, an optical low-pass filter 20a or an optical high-pass filter 20b may be used. FIG. 7A describes a case in which the optical low-pass filter 20a is used. Referring to FIG. 7A, the optical low-pass filter 20a outputs an in-signal-band component and a component in a band higher than the signal band, which are included in light output from the semiconductor optical amplifier 10, from a first port thereof and inputs them into the optical coupler 30. Furthermore, the optical low-pass filter 20a outputs a component in a band lower than the signal band from a second port thereof and inputs it into the second optical power monitor 50.

Figure 7B:
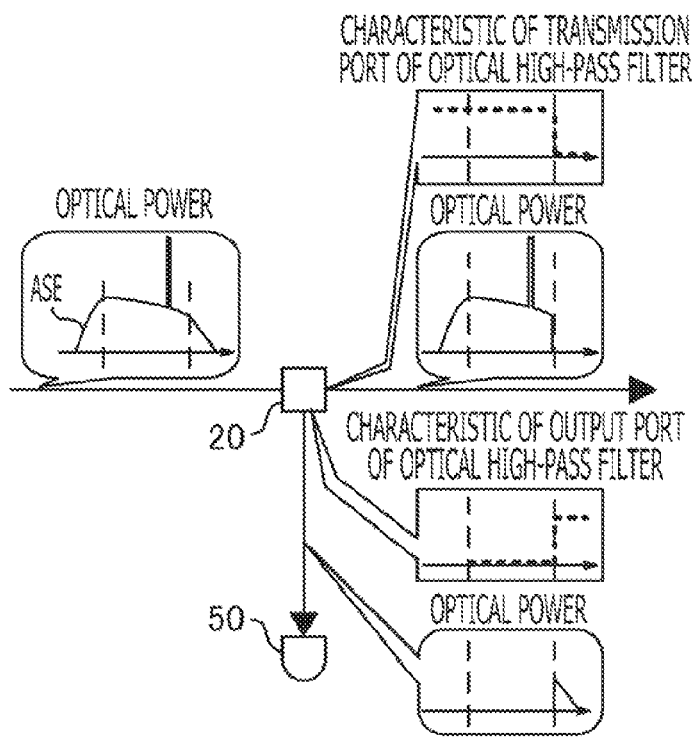
FIG. 7B describes a case in which an optical high-pass filter is used.

FIG. 7B describes a case in which the optical high-pass filter 20b is used. Referring to FIG. 7B, the optical high-pass filter 20b outputs an in-signal-band component and a component in a band lower than the signal band, which are included in light output from the semiconductor optical amplifier 10, from a first port thereof and inputs them into the optical coupler 30. Furthermore, the optical high-pass filter 20b outputs a component in a band higher than the signal band from a second port thereof and inputs it into the second optical power monitor 50.

Thus, the second optical power monitor 50 may monitor an out-of-signal-band component on a shorter wavelength side or a longer wavelength side with respect to the signal band. Since an optical low-pass filter transmits a low-frequency component, a component on the higher wavelength side is transmitted as illustrated in FIG. 7A. Since an optical high-pass filter transmits a high-frequency component, a component on the lower wavelength side is transmitted as illustrated in FIG. 7B.

Third Modification

Figure 8:
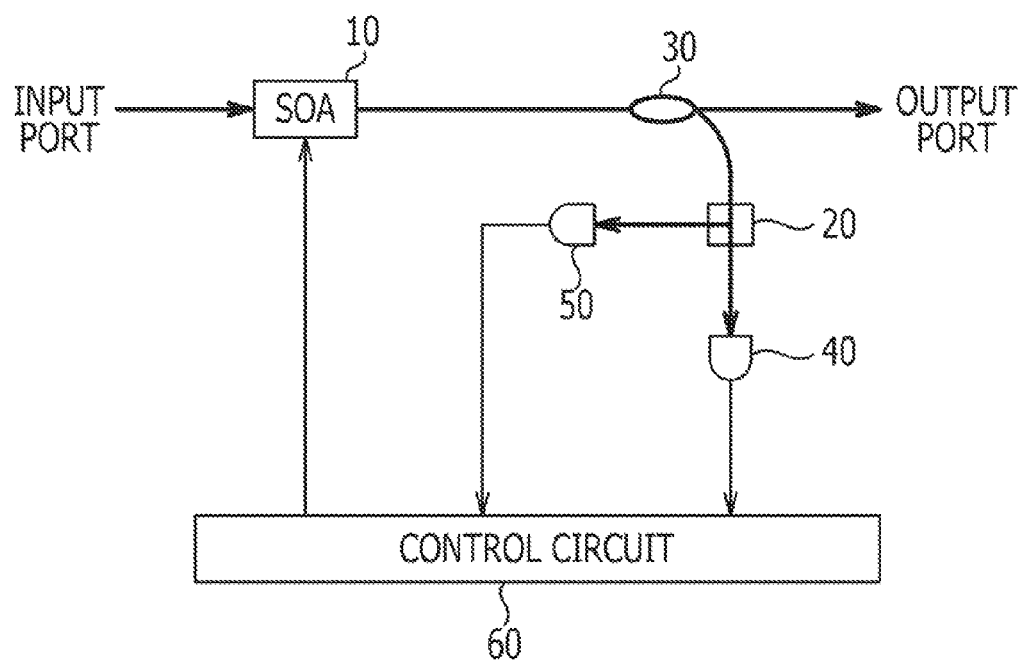
FIG. 8 describes another position of an optical band pass filter.

The optical band pass filter 20 is not necessarily provided as illustrated in FIG. 1. For example, the optical band pass filter 20 may be provided between the optical coupler 30 and the second optical power monitor 50 as illustrated in FIG. 8. In this case, the optical band pass filter 20 transmits an in-signal-band component from the first port thereof to the first optical power monitor 40, and transmits an out-of-signal-band component from the second port thereof to the second optical power monitor 50.

Fourth Modification

Figure 9:
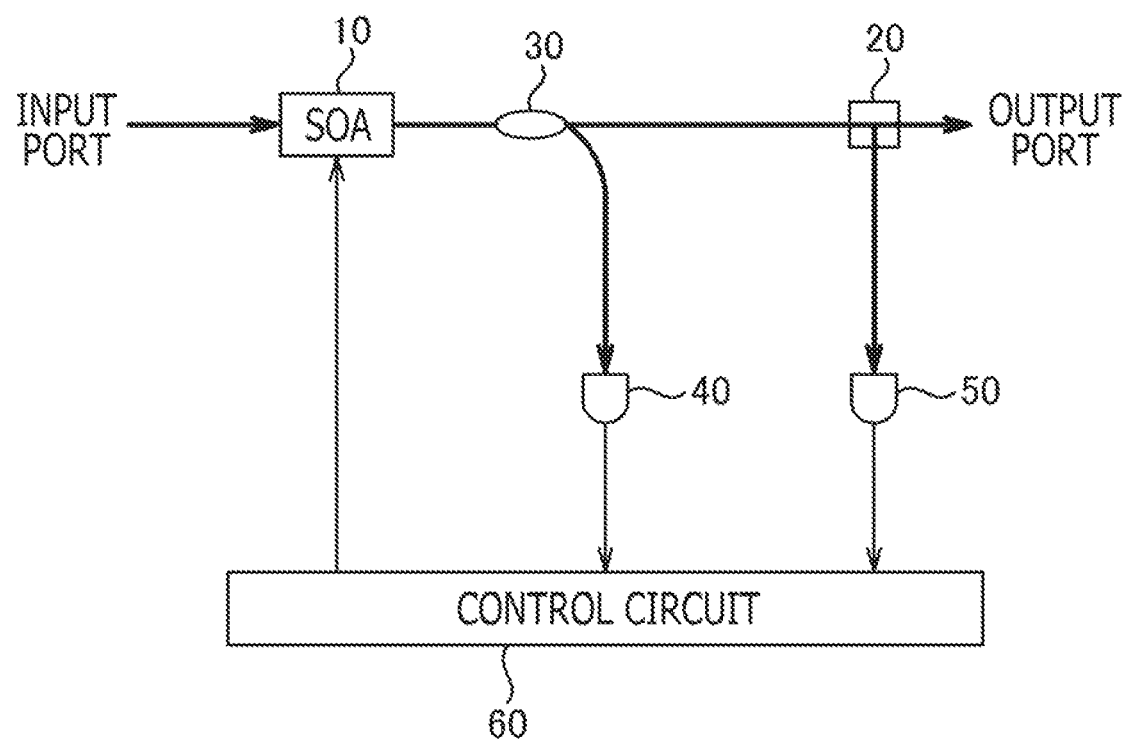
FIG. 9 describes a case in which an optical coupler is provided at a stage prior to an optical band pass filter.

The positional relationship between the optical band pass filter 20 and the optical coupler 30 may be changed. For example, the optical coupler 30 may be provided at a stage prior to the optical band pass filter 20 as illustrated in FIG. 9.

Second Embodiment

Figure 10:
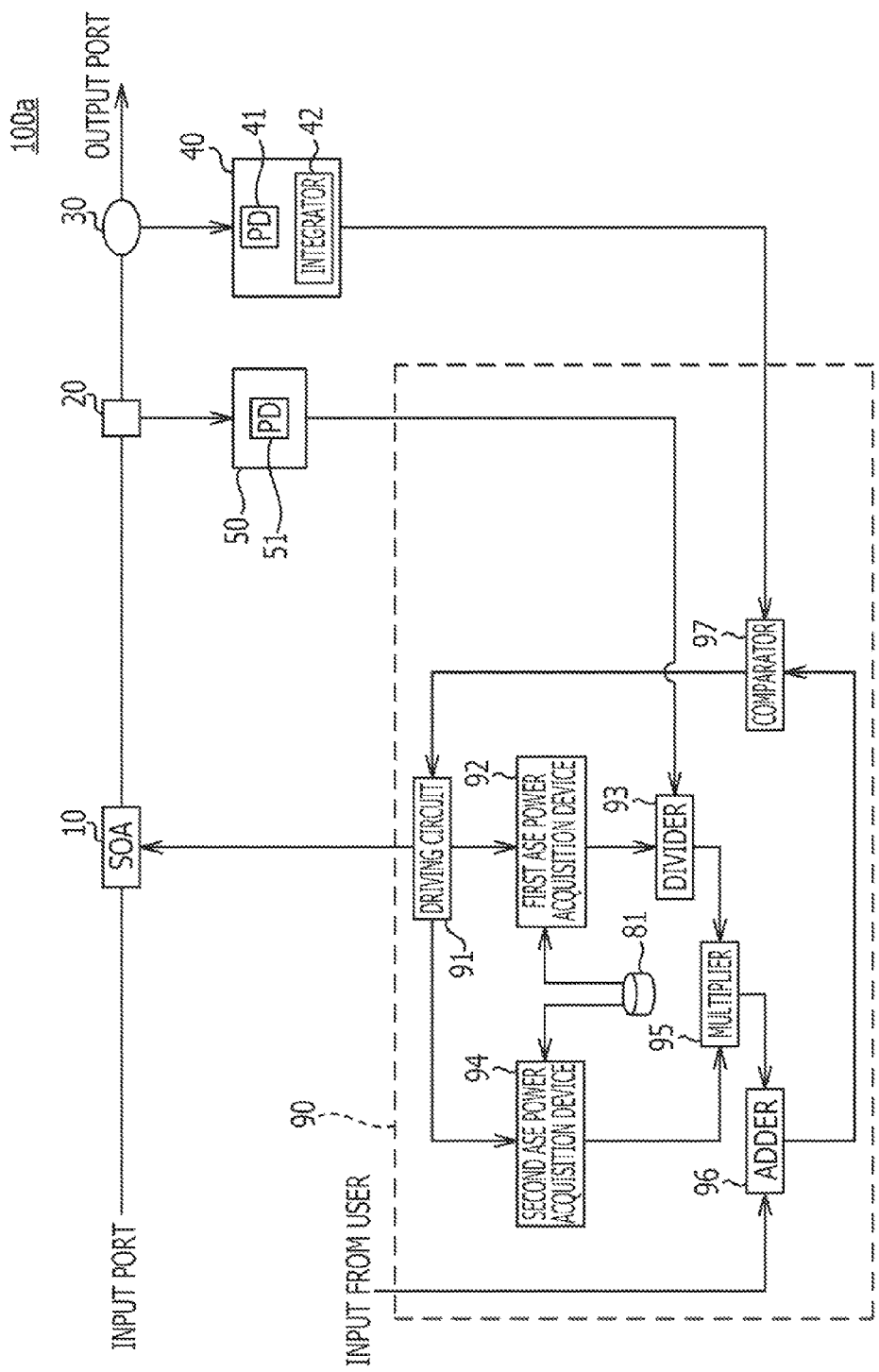
FIG. 10 describes an entire configuration of an optical amplifier according to a second embodiment.

In the first embodiment, a table describing the relationship between a driving current and ASE power is corrected. In the second embodiment, a case in which the correction of the table describing the relationship between a driving current and ASE power is not performed will be described. FIG. 10 is a block diagram describing an entire configuration of an optical amplifier 100a according to the second embodiment. Referring to FIG. 10, the difference between the optical amplifier 100a and the optical amplifier 100 illustrated in FIG. 1 is that the optical amplifier 100a includes a control circuit 90 instead of the control circuit 60. The control circuit 90 includes a driving circuit 91, a first ASE power acquisition device 92, a divider 93, a second ASE power acquisition device 94, a multiplier 95, an adder 96, and a comparator 97.

Next, the operation of the control circuit 90 will be described in detail below with reference to FIG. 10. The first ASE power acquisition device 92 acquires the driving current information Ik from the driving circuit 91. The driving current information Ik is a value of the driving current input from the driving circuit 91 into the semiconductor optical amplifier 10. The first ASE power acquisition device 92 acquires factory default out-of-signal-band ASE power Qk corresponding to the driving current information Ik from the database 81 and inputs it into the divider 93. On the other hand, the second optical power monitor 50 acquires the out-of-signal-band ASE power Q with the photodiode 51.

The divider 93 acquires the ratio between the out-of-signal-band ASE power Q and the factory default out-of-signal-band ASE power Qk, Q/Qk, as a correction coefficient and inputs the correction coefficient into the multiplier 95. The second ASE power acquisition device 94 acquires from the database 81 factory default in-signal-band ASE power Pk corresponding to the driving current information Ik and inputs the factory default in-signal-band ASE power Pk into the multiplier 95. The multiplier 95 multiplies the factory default in-signalband ASE power Pk by Q/Qk and inputs a result of the multiplication of Pk×Q/Qk into the adder 96.

The adder 96 receives the target signal output optical power S input by a user, adds the result of the multiplication of Pk×Q/Qk input from the multiplier 95 to the target signal output optical power S, and inputs a result of the addition, Dk=S+Pk×Q/Qk, to the comparator 97. The first optical power monitor 40 monitors the total output optical power T of the semiconductor optical amplifier 10 and inputs it into the comparator 97.

The comparator 97 compares the total output optical power T and the addition result Dk to each other. When the addition result Dk is higher than the total output optical power T, the driving circuit 91 increases the driving current for the semiconductor optical amplifier 10. When the addition result Dk is lower than the total output optical power T, the driving circuit 91 reduces the driving current for the semiconductor optical amplifier 10. When the addition result Dk is equal to the total output optical power T, the driving circuit 91 maintains the driving current for the semiconductor optical amplifier 10. Since the total output optical power of the semiconductor optical amplifier 10 is set to a desired value by controlling the driving current, signal output optical power is set to the target signal output power.

Figure 11:
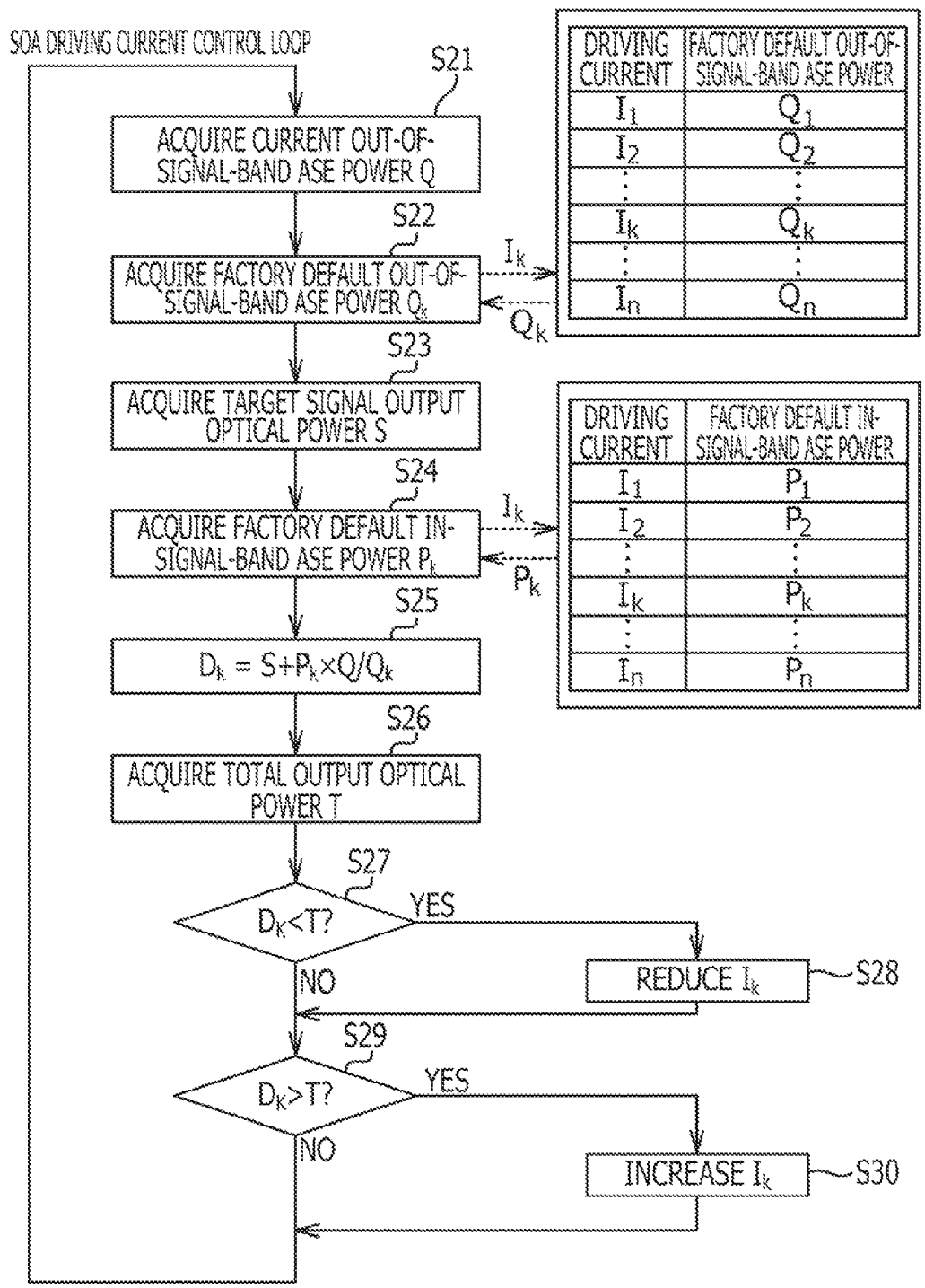
FIG. 11 describes an example of a method performed by a control circuit.

FIG. 11 describes an example of a method performed by the control circuit 90. Referring to FIG. 11, the control circuit 90 acquires the out-of-signal-band ASE power Q from the second optical power monitor 50 (operation S21). The first ASE power acquisition device 92 acquires the factory default out-of-signal-band ASE power Qk from the database 81 by using the driving current Ik as a search key (operation S22).

The control circuit 90 acquires the target signal output optical power S input by a user (operation S23). The second ASE power acquisition device 94 acquires the factory default in-signal-band ASE power Pk from the database 81 by using the driving current Ik as a search key (operation S24). The divider 93, the multiplier 95, and the adder 96 perform computation so as to obtain a computation result of Dk=S+Pk×Q/Qk (operation S25).

The control circuit 90 acquires the total output optical power T from the first optical power monitor 40 (operation S26). The comparator 97 determines whether the computation result Dk is lower than the total output optical power T (operation S27). When the determination result is Yes in operation S27, the driving circuit 91 reduces the driving current (operation S28).

When it is determined that the computation result Dk is not lower than the total output optical power T after operation S28 has been performed, or when the determination result is No in operation S27, the comparator 97 determines whether the computation result Dk is higher than the total output optical power T (operation S29). When the determination result is Yes in operation S29, the driving circuit 91 increases the driving current (operation S30). When it is determined that the computation result Dk is not higher than the total output optical power T after operation S30 has been performed, or when the determination result is No in operation S29, operation S21 is performed.

In this embodiment, by monitoring out-of-signal-band ASE power, it is possible to correct the relationship between the driving current for the semiconductor optical amplifier 10 and ASE power. It is therefore unnecessary to interrupt an input signal at the time of correction of the relationship between the driving current for the semiconductor optical amplifier 10 and ASE power. Furthermore, the relationship between the driving current for the semiconductor optical amplifier 10 and ASE power can be continuously corrected. It is therefore possible to respond to a sudden change in ASE power of the semiconductor optical amplifier 10. Since it is unnecessary to correct a table describing the relationship between the driving current for the semiconductor optical amplifier 10 and ASE power, processing is simplified. Even if the ratio between the out-of-signal-band ASE power Q and the factory default out-of-signal-band ASE power Qk, that is, Q/Qk, is changed in accordance with the driving current, ASE power can be appropriately corrected.

In this embodiment, the control circuit 90 functions as a corrector for correcting the relationship between the driving current for the semiconductor optical amplifier 10 and ASE power. The optical band pass filter 20 and the second optical power monitor 50 function as a noise optical power monitor for monitoring out-of-signal-band noise optical power output from the semiconductor optical amplifier 10. The first optical power monitor 40 functions as an optical power monitor for monitoring total output optical power of light output from the semiconductor optical amplifier 10. The driving circuit 91 functions as a driver for controlling the driving current for the semiconductor optical amplifier 10.

Third Embodiment

In the above-described embodiments, the target signal output optical power S input by a user is used. In the third embodiment, a case in which a target gain G input by a user is used will be described. A gain is a value obtained by dividing output signal optical power by input signal optical power. The target gain G is a target gain value of the semiconductor optical amplifier 10 requested by a user.

Figure 12:
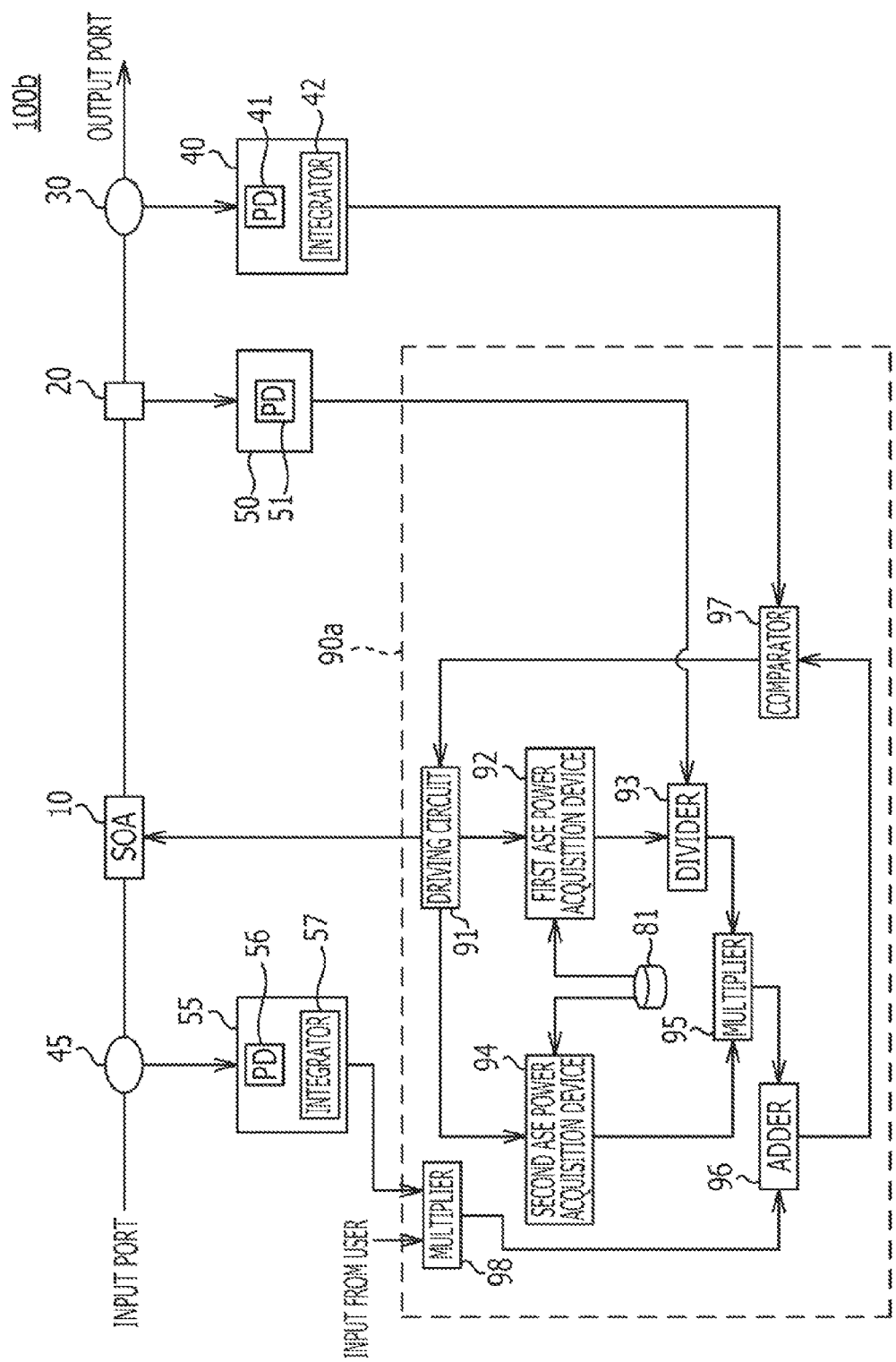
FIG. 12 describes an entire configuration of an optical amplifier according to a third embodiment.

FIG. 12 is a block diagram describing an entire configuration of an optical amplifier 100b according to the third embodiment. Referring to FIG. 12, the difference between the optical amplifier 100b and the optical amplifier 100a illustrated in FIG. 10 is that the optical amplifier 100b includes a control circuit 90a instead of the control circuit 90 and includes an optical coupler 45 and a third optical power monitor 55. The difference between the control circuit 90a and the control circuit 90 is that the control circuit 90a includes a multiplier 98. The optical coupler 45 is provided at a stage prior to the semiconductor optical amplifier 10. The optical coupler 45 transmits an optical signal, which has been input into an input port, to the semiconductor optical amplifier 10, and partly transmits the optical signal to the third optical power monitor 55. The third optical power monitor 55 includes a photodiode 56 and an integrator 57.

Next, the operation of the control circuit 90a will be described in detail below with reference to FIG. 12. The first ASE power acquisition device 92 acquires the driving current information Ik from the driving circuit 91. The driving current information Ik is a value of the driving current that is input from the driving circuit 91 into the semiconductor optical amplifier 10. The first ASE power acquisition device 92 acquires the factory default out-of-signal-band ASE power Qk corresponding to the driving current information Ik from the database 81 and inputs it into the divider 93. On the other hand, the second optical power monitor 50 acquires the out-of-signal-band ASE power Q with the photodiode 51.

The divider 93 acquires the ratio between the out-of-signal-band ASE power Q and the factory default out-of-signal-band ASE power Qk, that is, Q/Qk, as a correction coefficient and inputs the correction coefficient into the multiplier 95. The second ASE power acquisition device 94 acquires from the database 81 the factory default in-signal-band ASE power Pk corresponding to the driving current information Ik and inputs the factory default in-signal-band ASE power Pk into the multiplier 95. The multiplier 95 multiplies the factory default in-signal-band ASE power Pk by Q/Qk and inputs a result of the multiplication of Pk×Q/Qk into the adder 96.

The third optical power monitor 55 integrates electric signals obtained by photoelectric conversion performed by the photodiode 56, monitors signal input optical power U input into the semiconductor optical amplifier 10, and inputs the signal input optical power U into the multiplier 98. The multiplier 98 receives the target gain G input by a user, multiplies the signal input optical power U by the target gain G, and inputs a result of the multiplication to the adder 96. The adder 96 adds the result of the computation of the multiplier 95 and the result of the computation of the multiplier 98, that is, performs computation with an equation of Dk=U×G+Pk×Q/Qk, and inputs a result of the computation into the comparator 97. The first optical power monitor 40 monitors the total output optical power T of the semiconductor optical amplifier 10 and inputs it into the comparator 97.

The comparator 97 compares the total output optical power T and the computation result Dk to each other. When the computation result Dk is higher than the total output optical power T, the driving circuit 91 increases the driving current for the semiconductor optical amplifier 10. When the computation result Dk is lower than the total output optical power T, the driving circuit 91 reduces the driving current for the semiconductor optical amplifier 10. When the computation result Dk is equal to the total output optical power T, the driving circuit 91 maintains the driving current for the semiconductor optical amplifier 10. Since the total output optical power of the semiconductor optical amplifier 10 is set to a desired value by controlling the driving current, the gain is set to a target gain.

Figure 13:
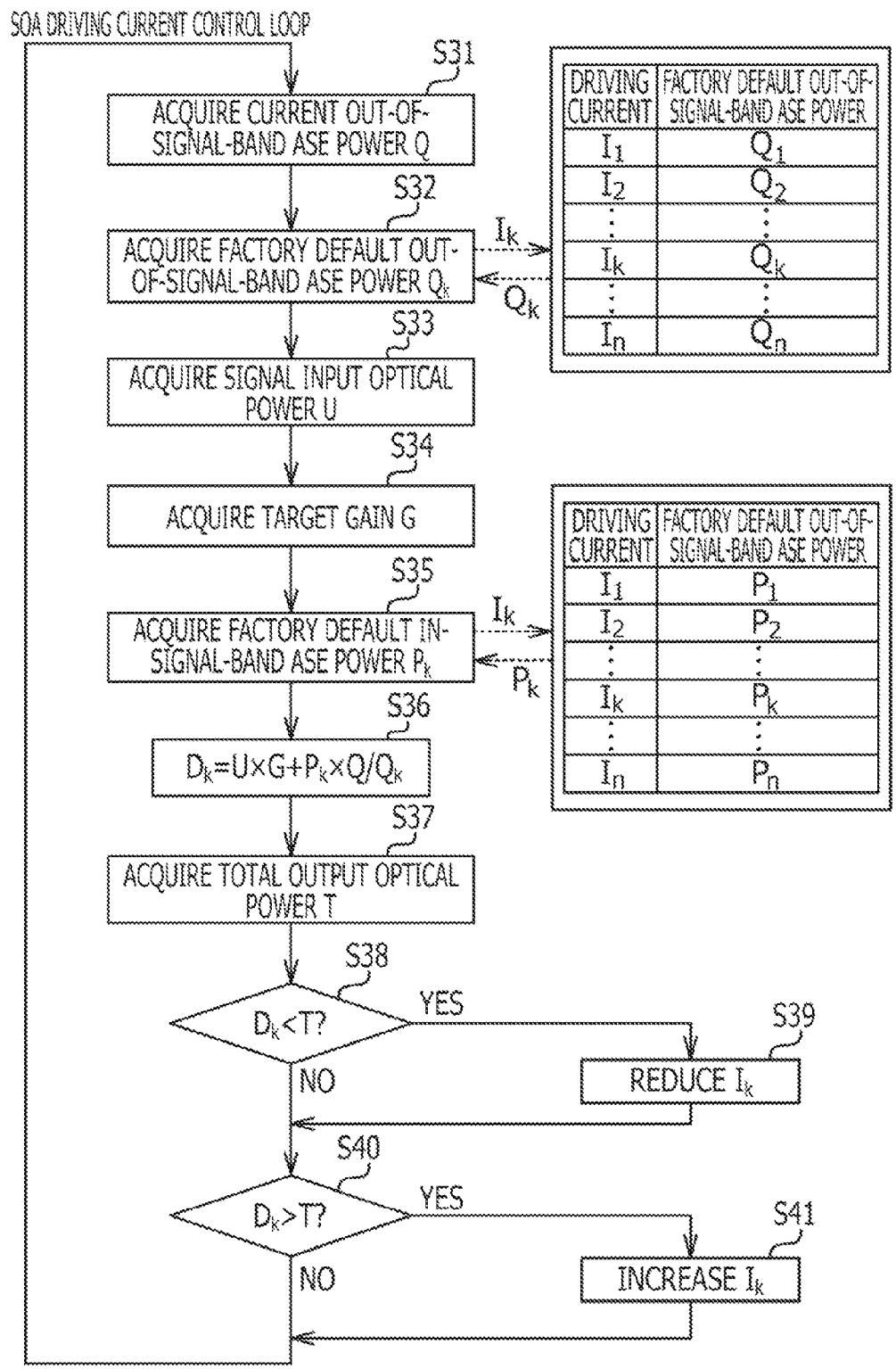
FIG. 13 describes an example of a method performed by a control circuit.

FIG. 13 describes an example of a method performed by the control circuit 90a. Referring to FIG. 13, the control circuit 90a acquires the out-of-signal-band ASE power Q from the second optical power monitor 50 (operation S31). The first ASE power acquisition device 92 acquires the factory default out-of-signal-band ASE power Qk from the database 81 by using the driving current Ik as a search key (operation S32).

The control circuit 90a acquires the signal input optical power U from the third optical power monitor 55 (operation S33). The control circuit 90a acquires the target gain G input by a user (operation S34). The second ASE power acquisition device 94 acquires the factory default in-signal-band ASE power Pk from the database 81 by using the driving current Ik as a search key (operation S35).

The divider 93, the multiplier 95, the adder 96, and the multiplier 98 perform computation so as to obtain a computation result of Dk=U×G+Pk×Q/Qk (operation S36). The control circuit 90 acquires the total output optical power T from the first optical power monitor 40 (operation S37). The comparator 97 determines whether the computation result Dk is lower than the total output optical power T (operation S38). When the determination result is Yes in operation S38, the driving circuit 91 reduces the driving current (operation S39).

When it is determined that the computation result Dk is not lower than the total output optical power T after operation S39 has been performed, or when the determination result is No in operation S38, the comparator 97 determines whether the computation result Dk is higher than the total output optical power T (operation S40). When the determination result is Yes in operation S40, the driving circuit 91 increases the driving current (operation S41). When it is determined that the computation result Dk is not higher than the total output optical power T after operation S41 has been performed, or when the determination result is No in operation S40, operation S31 is performed.

In this embodiment, by monitoring out-of-signal-band ASE power, it is possible to correct the relationship between the driving current for the semiconductor optical amplifier 10 and ASE power. It is therefore unnecessary to interrupt an input signal at the time of correction of the relationship between the driving current for the semiconductor optical amplifier 10 and ASE power. Furthermore, the relationship between the driving current for the semiconductor optical amplifier 10 and ASE power can be continuously corrected. It is therefore possible to respond to a sudden change in ASE power of the semiconductor optical amplifier 10. Since it is unnecessary to correct a table describing the relationship between the driving current for the semiconductor optical amplifier 10 and ASE power, processing is simplified. Even if the ratio between the out-of-signal-band ASE power Q and the factory default out-of-signal-band ASE power Qk, that is, Q/Qk, is changed in accordance with the driving current, ASE power can be appropriately corrected.

In this embodiment, correction of the table describing the relationship between the driving current for the semiconductor optical amplifier 10 and ASE power is not performed. However, like in the first embodiment, the correction of the table describing the relationship between the driving current for the semiconductor optical amplifier 10 and ASE power may be performed. In this embodiment, the control circuit 90a functions as a corrector for correcting the relationship between the driving current for the semiconductor optical amplifier 10 and ASE power. The optical band pass filter 20 and the second optical power monitor 50 function as a noise optical power monitor for monitoring out-of-signal-band noise optical power output from the semiconductor optical amplifier 10. The first optical power monitor 40 functions as an optical power monitor for monitoring total output optical power of light output from the semiconductor optical amplifier 10. The driving circuit 91 functions as a driver for controlling the driving current for the semiconductor optical amplifier 10.

While the present invention has been described with reference to exemplary embodiments, it is to be understood that the invention is not limited to the disclosed exemplary embodiments. The scope of the claims is to be accorded the broadest interpretation so as to encompass all modifications and equivalent structures and functions.

An optical amplifier according to an embodiment of the present invention, a control circuit according to an embodiment of the present invention, and an optical amplifier control method according to an embodiment of the present invention can correct the relationship between a driving current for a semiconductor optical amplifier and a noise optical power without interrupting a signal input into the semiconductor optical amplifier, even if the relationship is changed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The invention claimed is:
1. An optical amplifier comprising:
a semiconductor optical amplifier;

a first power monitor configured to monitor an optical power of an out-of-signal-band noise output from the semiconductor optical amplifier;

a corrector configured to correct a relationship between a driving current for the semiconductor optical amplifier and a noise optical power based on the out-of-signal-band noise optical power monitored by the first power monitor, wherein the corrector corrects target total output optical power obtained by adding target signal output optical power to an out-of-signal-band noise optical power corresponding to the driving current using a correction coefficient, and a second power monitor configured to monitor total output optical power of light output from the semiconductor optical amplifier; and a driver configured to control the driving current based on results of a comparison between the target total output optical power corrected by the corrector and the total output optical power monitored by the second power monitor.

2. The optical amplifier according to claim 1, wherein the corrector corrects the relationship between the driving current for the semiconductor optical amplifier and the noise optical power by using a ratio between the noise optical power and a reference out-of-signal-band noise optical power as a correction coefficient.

3. The optical amplifier according to claim 1, further comprising
a memory configured to store a relationship between the driving current and the target total output optical power corrected by the corrector in a form of a table.

4. An optical amplifier comprising:
a semiconductor optical amplifier;
a first power monitor configured to monitor an optical power of an out-of-signal-band noise output from the semiconductor optical amplifier;
a corrector configured to correct a relationship between a driving current for the semiconductor optical amplifier and a noise optical power based on the out-of-signal-band noise optical power monitored by the first power monitor,
wherein the corrector corrects target total output optical power obtained by adding target signal output optical power to an out-of-signal-band noise optical power corresponding to the driving current using a correction coefficient; and
a second power monitor configured to monitor the total output optical power of light output from the semiconductor optical amplifier; and
a driver configured to acquire from the table the target total output optical power corresponding to the driving current presently being output, compares the target total output optical power and the total output optical power monitored by the second power monitor with each other, and controls the driving current based on a result of the comparison.

5. The optical amplifier according to claim 1, wherein the target signal output optical power is a product of optical power input into the semiconductor optical amplifier and a target gain set for the semiconductor optical amplifier.

6. The optical amplifier according to claim 2, wherein the reference out-of-signal-band noise optical power is the out-of-signal-band noise optical power of the semiconductor optical amplifier obtained at a time of shipment of the optical amplifier.

7. The optical amplifier according to claim 1, wherein the first power monitor is a high-pass filter, a low-pass filter, or a band pass filter.

8. A control circuit comprising:
a first power monitor configured to monitor an optical power of an out-of-signal-band noise output from a semiconductor optical amplifier;
a corrector configured to correct a relationship between a driving current for the semiconductor optical amplifier and a noise optical power based on the out-of-signal-band noise optical power monitored by the first power monitor,
wherein the corrector corrects target total output optical power obtained by adding target signal output optical power to an out-of-signal-band noise optical power corresponding to the driving current using a correction coefficient, and
a second power monitor configured to monitor total output optical power of light output from the semiconductor optical amplifier; and
a driver configured to control the driving current based on results of a comparison between the target total output optical power corrected by the corrector and the total output optical power monitored by the second power monitor.

9. An optical amplifier control method comprising:
monitoring an optical power of out-of-signal-band noise output from a semiconductor optical amplifier; and
correcting a relationship between the driving current for the semiconductor optical amplifier and a noise optical power output from the semiconductor optical amplifier, based on the monitored optical power,
wherein the correcting corrects target total output optical power obtained by adding target signal output optical power to an out-of-signal-band noise optical power corresponding to the driving current using a correction coefficient, and the method further comprises
monitoring total output optical power of light output from the semiconductor optical amplifier; and
controlling the driving current based on results of a comparison between the target total output optical power corrected by the correcting and the total output optical power monitored by the monitoring total output optical power.

* * * * *